United States Patent
Bronson et al.

(10) Patent No.: US 6,182,237 B1
(45) Date of Patent: Jan. 30, 2001

(54) SYSTEM AND METHOD FOR DETECTING PHASE ERRORS IN ASICS WITH MULTIPLE CLOCK FREQUENCIES

(75) Inventors: Timothy C. Bronson, Vestal, NY (US); Bruce G. Rudolph, Rochester, MN (US)

(73) Assignee: International Business Machines Corporation, Armonk, NY (US)

(*) Notice: Under 35 U.S.C. 154(b), the term of this patent shall be extended for 0 days.

(21) Appl. No.: 09/144,758

(22) Filed: Aug. 31, 1998

(51) Int. Cl.[7] ............................................. G06F 1/12
(52) U.S. Cl. ............................................................. 713/503
(58) Field of Search .................................. 713/400, 503; 375/354, 359, 371; 327/141, 144, 145

(56) References Cited

U.S. PATENT DOCUMENTS

| | | |
|---|---|---|
| 4,416,680 | 11/1983 | Brüning et al. . |
| 4,528,163 | 7/1985 | Albrecht . |
| 4,559,607 | 12/1985 | Lu ........................................ 364/728 |
| 4,675,886 | 6/1987 | Surie ................................... 375/116 |
| 4,756,011 | 7/1988 | Cordell ................................ 375/118 |
| 4,759,787 | 7/1988 | Winterburn . |
| 4,804,422 | 2/1989 | Papanikoleau . |
| 4,821,296 | 4/1989 | Cordell ................................ 375/119 |
| 4,852,124 * | 7/1989 | Raucci ................................. 375/293 |
| 4,935,046 | 6/1990 | Uchikawa et al. . |
| 4,956,208 | 9/1990 | Uchikawa et al. . |
| 5,278,873 | 1/1994 | Lowrey et al. ...................... 375/118 |
| 5,528,637 | 6/1996 | Sevenhans et al. ................. 375/371 |
| 5,581,699 | 12/1996 | Casal et al. ...................... 395/185.08 |
| 5,619,148 | 4/1997 | Guo .......................................... 327/3 |
| 5,637,284 | 6/1997 | Sato et al. . |
| 5,762,672 | 6/1998 | Ikeda et al. . |
| 5,910,740 * | 6/1999 | Underwood ......................... 327/149 |

FOREIGN PATENT DOCUMENTS 1-233849  9/1989  (JP) .

OTHER PUBLICATIONS

High Resolution Digital Phase Detector, IBM Technical Disclosure Bulletin, vol. 32, No. 3B, Aug. 1989, pp. 307–309.

* cited by examiner

Primary Examiner—Thomas M. Heckler
(74) Attorney, Agent, or Firm—Shelly M Beckstrand (57) ABSTRACT

A phase error detection circuit apparatus and method for detecting phase misalignment between first clock signals operating in a slow time domain and second clock signals operating in a fast time domain. A frequency divider and shift register are clocked in the slow time domain to sequentially sample all possible alignments of the first clock signals. A second shift register is clocked in the fast time domain and operates responsive to the output of the frequency divider and shift register to generate a phase alignment error signal when the phase alignment is incorrect or the frequency divider is not switching in a correct cycle. Error detection logic clocked in the slow time domain samples and optionally masks the phase error signal. State machine logic may be provided to generate an output error signal when each possible phase alignment results in a phase alignment error signal.

13 Claims, 9 Drawing Sheets

SYSTEM AND METHOD FOR DETECTING PHASE ERRORS IN ASICS WITH MULTIPLE CLOCK FREQUENCIES

BACKGROUND OF THE INVENTION

1. Technical Field of the Invention

This invention relates to phase error detection. More specifically, it relates to the detection of phase errors between different clock domains in application specific integrated circuit chips (ASICs).

2. Background Art

Clock phase alignment errors can occur in any application specific integrated circuit (ASIC) chip which employs multiple clocks running synchronously at different frequencies. Examples of such chips include microprocessors with high frequency internal clocks and slower bus interface clocks, memory controller chips with one clock frequency for a system bus and another clock frequency for a dedicated memory bus, and I/O bridge chips which communicate with multiple buses running at different frequencies.

Synchronous communications between any two clock domains requires that the phase relationship between the clocks remain constant. A phase alignment error exists when the phase relationship between two synchronous domains does not remain constant, or is not initialized to the alignment for which the cross domain circuitry is designed. This error condition results in incorrect and missing data during communications between clock domains and consequently causes multiple secondary error effects. Since existing error checking mechanisms are unable to detect phase alignment errors, one or more of the secondary errors is perceived to be a primary error. In a customer environment this results in incorrect failure isolation and unnecessary replacement of parts. In a lab bring up environment it becomes necessary to spend extra time attaching fast oscilloscopes to systems under test when phase alignment errors are suspected.

A particular memory and I/O controller chip, for example, communicates with processors, external memory, and I/O devices. The internal circuits of this chip are partitioned into multiple clock domains which operate at frequencies that match the associated external devices. In this specific example, internal circuits are divided into three clock domains: a processor clock domain, a memory clock domain, and an I/O clock domain. In order to minimize latencies and improve system performance, the memory and processor clock domains inside the chip operate synchronously at a frequency ratio of 2:3. Consequently, the chip is susceptible to phase alignment errors either as a result of circuit failure or incorrect phase locked loop (PLL) initialization.

Figure 1:
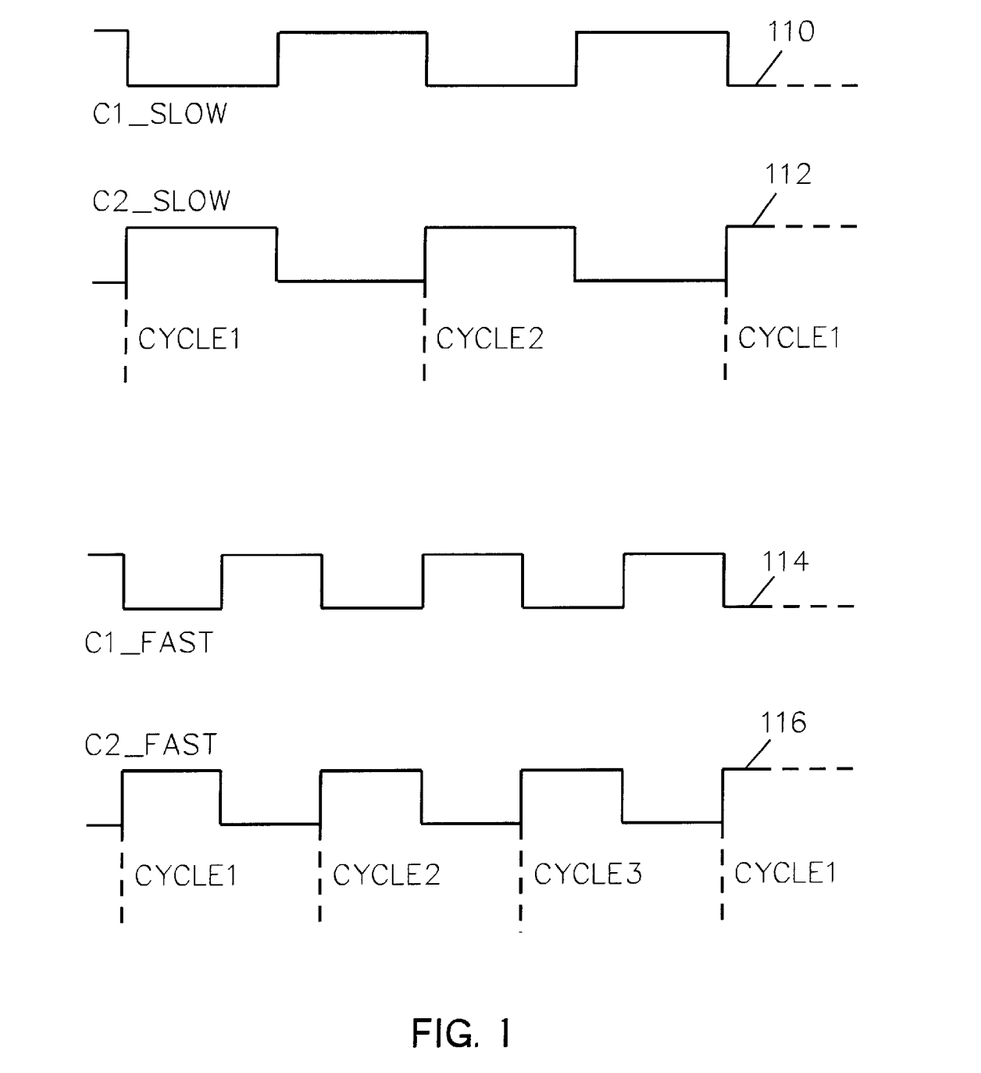
FIG. 1 is a timing chart illustrating the correct phase relationship at a synchronous 2:3 frequency ratio.

Referring to FIG. 1, the correct phase relationship at a synchronous 2:3 frequency ratio is illustrated.

It is an object of the invention to provide a circuit for detecting clock phase alignment errors.

It is a further object of the invention to provide for correct failure isolation.

It is a further object of the invention to detect phase alignment errors in an ASIC, such as those arising from circuit failure or incorrect PLL initialization.

It is a further object of the invention to detect incorrect clock phase alignment between synchronous clock domains by using fully synchronous signals and not requiring sampling rates in excess of the clock frequencies in either of the two domains being monitored.

It is a further object of the invention to detect incorrect clock phase alignment between synchronous clock domains with detection circuitry which performs accurately over the same process range that the rest of the chip is designed to meet, and do so without placing special requirements on logic synthesis and timing tools, without custom design techniques, and without embedded analog circuits.

SUMMARY OF THE INVENTION

In accordance with the invention, phase misalignment is detected between first clock signals defining a slow time domain and second clock signals defining a fast time domain. All possible alignments of clock signals operating in the slow time domain are sampled to generate a sequence of alignment signals. These alignment signals are clocked to detector logic operating in the fast time domain to generate a phase error signal when the phase alignment is incorrect.

Other features and advantages of this invention will become apparent from the following detailed description of the presently preferred embodiment of the invention, taken in conjunction with the accompanying drawings.

BEST MODE FOR CARRYING OUT THE INVENTION

In the following description:

ω_slow is the frequency of the slow clock.

ω_fast is the frequency of the fast clock.

Frequency ratio=(s/f)=(ω_slow/ω_fast).

The optimal, or correct, phase relationship is defined to be one in which there is one clock cycle that begins with rising edge of the slave, or send, clocks in each domain. This cycle, referred to as cycle 1, of simultaneous rising clock edges is repeated every (s) slow cycles, which is the same as (f) fast cycles.

Referring to FIG. 1, clock signal c2_slow 112 is the slave signal of clock signal c1_slow 110, and c2_fast 116 is the slave signal of clock signal c1_fast 114. As illustrated, the rising edge of signal 112 cycle 1 coincides with the rising edge of signal 116 cycle 1. Consequently, clock signals 112 and 116 are in correct phase relationship.

Figures 2, 2A:
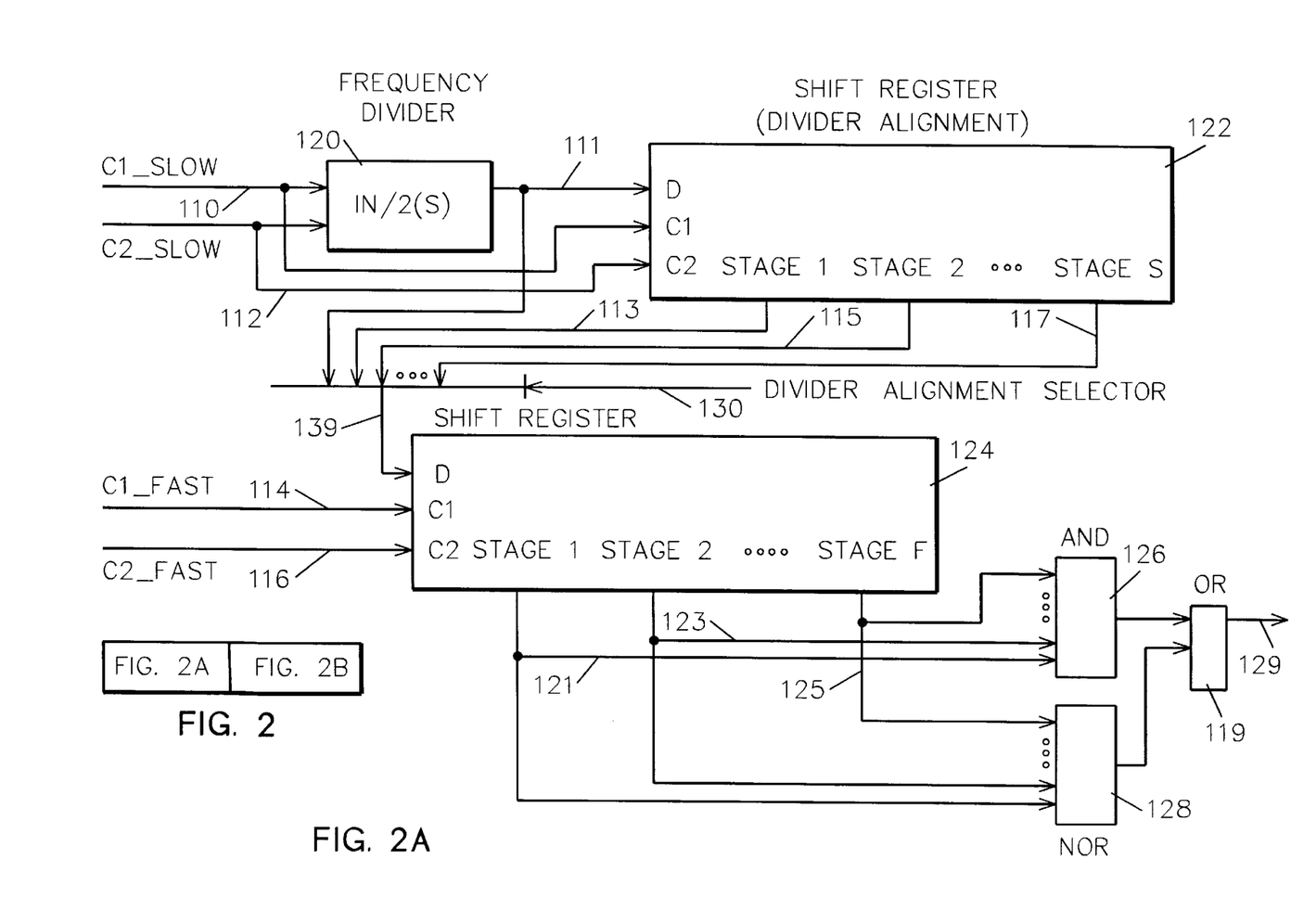
FIGS. 2A and 2B, arranged as illustrated in FIG. 2, are a logic diagram illustrating a preferred embodiment of the invention.
Figure 2B:
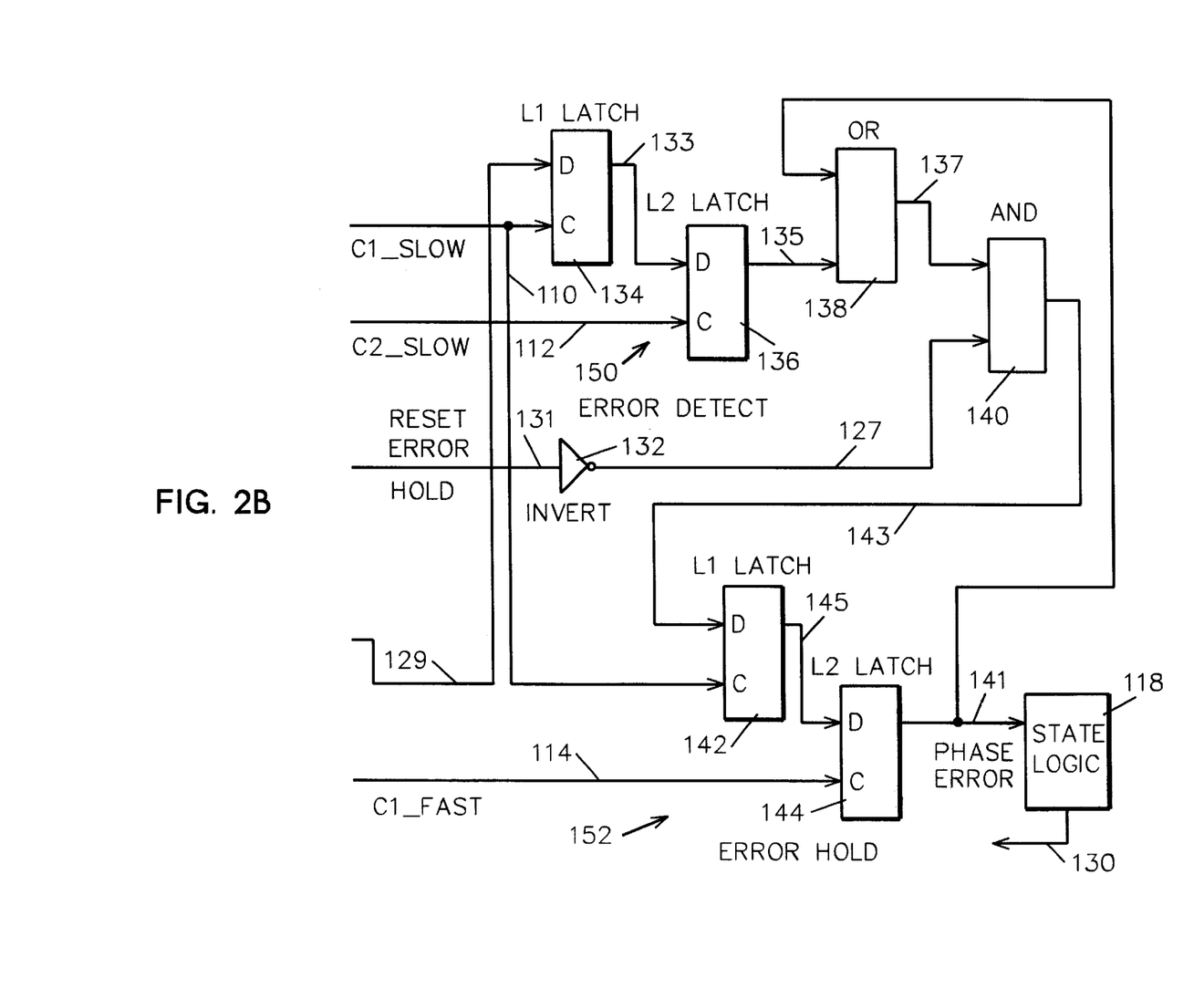

Referring to FIGS. 2A and 2B, a logic circuit is illustrated which is able to detect incorrect clock phase alignment between synchronous clock domains.

In structure, the clock phase alignment detection circuit of this first embodiment of the invention includes frequency divider 120, divider alignment shift register 122, divider alignment selector 130, shift register 124, error detect logic 150 and error hold logic 152. Inputs to the clock phase alignment detection circuit include c1_slow clock 110, c2_slow clock 112, c1_fast clock 114, c2_fast clock 116 and reset error hold 131.

c1_slow clock signal line 110 is fed to frequency divider 120, shift register 122, and to the control (C) inputs of error detect L1 latch 134 and error hold L1 latch 142. c2_slow clock signal line 112 is fed to frequency divider 120, shift register 122, and to the control input of error detect L2 latch 136. c1_fast clock signal line 114 is fed to shift register 124 and to the control input of error hold L2 latch 144. c2_fast clock signal line 116 is fed to shift register 124. Reset error hold signal line 131 is inverted at invert block 132 and fed on line 127 to AND gate 140.

The output of frequency divider 120 is fed on line 111 to the data input of shift register 122 and to divider alignment selector 130. Outputs of shift register 122 from stage 1 on line 113, stage 2 on line 115 and stage (s) on line 117 are also fed to divider alignment selector 130, the output of which is fed as alignment signals on line 139 to the data input of shift register 124. The outputs 121, 123, 125 from shift register 124 stages 1, 2, . . . ,n, respectively, are fed to AND gate 126 and NOR gate 128, the outputs of both of which are fed to OR gate 119. The output of OR gate 119 is fed on line 129 to the data input of error detect L1 latch 134, the output of which is fed to the data input of error detect L2 latch 136, the output of which is fed on line 135 to OR gate 138, the other input to which is phase error signal line 141. The output of OR gate 138 is fed on line 137 to AND gate 140, the output of which is fed on line 143 to the data input of error hold L1 latch 142. The output of latch 142 is fed to the data input of error hold L2 latch 144, the output of which is the final output on phase error output signal line 141 of the clock phase alignment detection logic of this embodiment of the invention.

In operation, frequency divider 120 is constructed using latches that are clocked in the ω_slow domain by clock signals c1_slow 110 and c2_slow. The output of divider 120 has a 50% duty cycle and oscillates at a frequency of (ω_slow/(2*s)). The output 111 of frequency divider 120 must be aligned such that each transition begins in the cycle in which the rising edge of the send clocks 112, 116 in both domains occurs at the same time (or the cycle in which this would occur if no phase error were present). Since it is impossible to guarantee the cycle alignment of the frequency divider 120 output 111, a shift register 122 is provided which operates in the ω_slow domain (under control of c1_slow 110 and c2_slow 112 at inputs C1, C2, respectively) and which has (s−1) stages. This shift register 122 is thereby enabled to sequentially sample all possible alignments.

The output 111 of divider 120, or the shifted output of divider 120 on shift register outputs 113, 115, 117, is multiplexed through divider alignment selector 130 to alignment signal line 139 and sampled at the data input D of a shift register 124 constructed from latches clocked in the ω_fast domain by clock signals 114, 116 at shift register clock inputs C1, C2, respectively. The number of stages in shift register 124 is (f). The outputs 121, 123, 125 of shift register 124 are gated through AND gate 126, NOR gate 128 and OR gate 119 to create a signal 129 which is active (true) only when all outputs of shift register 124 are equal. Thus, signal 129 is never active at the falling edge of the sample clock c1_slow 110 in the ω_slow domain, unless: (1) the phase alignment is incorrect, or (2) the output of frequency divider 120 is not switching in the correct cycle. Shift register 124, clocked by C1_fast 114 and C2_fast 116 in the fast time domain, together with gates 126, 128 and 119, comprise one specific embodiment of detector logic for generating a phase error signal when the phase alignment is incorrect.

Potential phase errors can then be detected by sampling this signal 129 with an error detect 150 latch pair 134, 136 operating in the ω_slow domain under control of clock signals 110, 112. The output 135 of error detect 150 latches 134, 136 is then combined in gates 138 and 140 with masking (such as phase error signal 141) and other optional control signals (such as reset error hold signal 131) before being captured from line 143 in error hold 152 latch pair 142, 144.

State machine logic 118 generates divider alignment selector control signal 130 to sequentially select a different alignment 111, 113, 115, 117 of the frequency divider 120 output and samples phase error signal 141 until an alignment is found that does not result in activation of the phase error signal 141 or until all alignments 111, 113, 115, 117 have been tried. If all possible alignments result in activation of the phase error signal 141 than a phase error is reported. If an alignment 111, 113, 115, or 117 is found which does not result in activation of phase error signal 141, then selection of that alignment is maintained and any subsequent activation of phase error signal 141 is considered to be a valid error.

Figures 3, 3A:
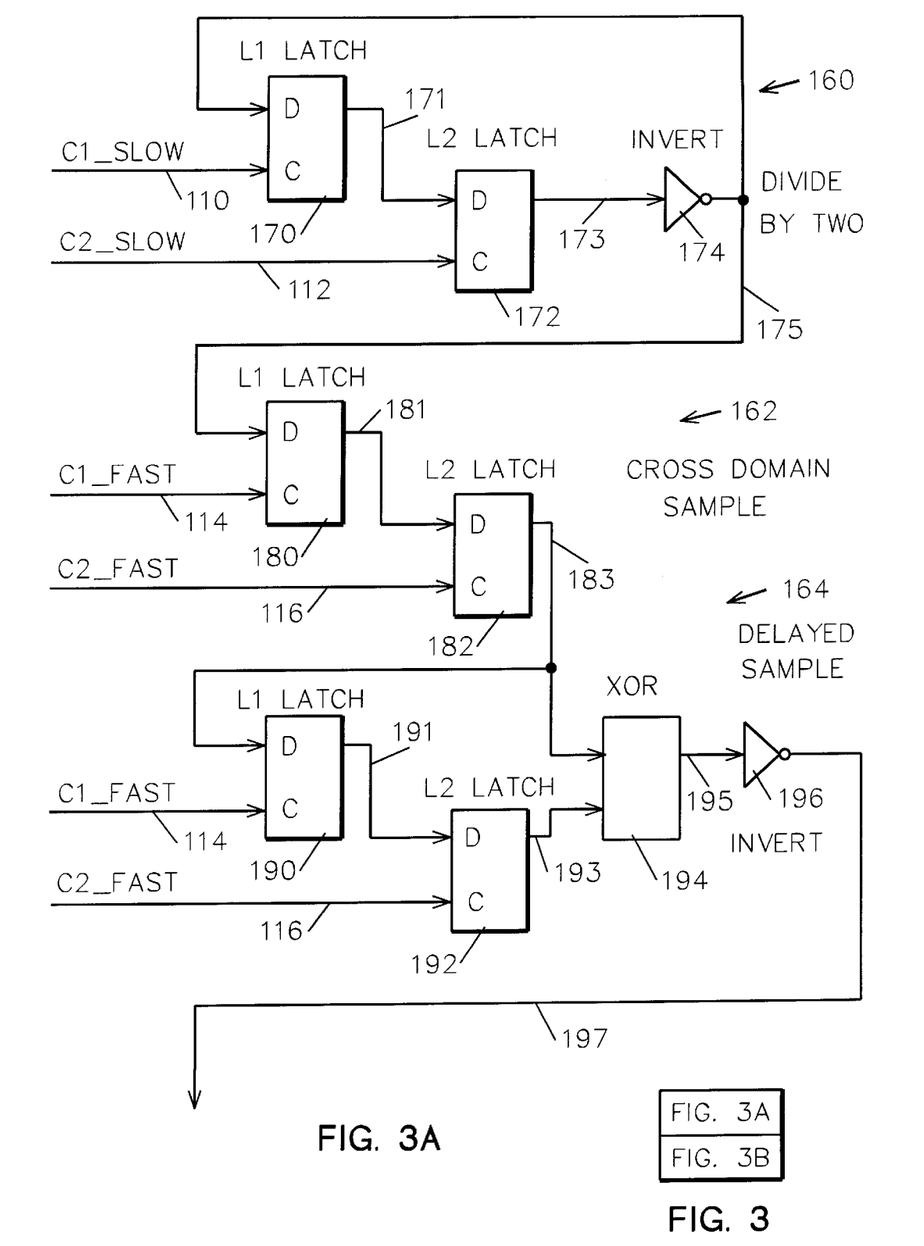
FIGS. 3A and 3B, arranged as illustrated in FIG. 3, are a logic diagram illustrating a specific embodiment of the invention for use in detecting phase relationship errors in a circuit designed for a synchronous 2:3 frequency ratio.
Figure 3B:
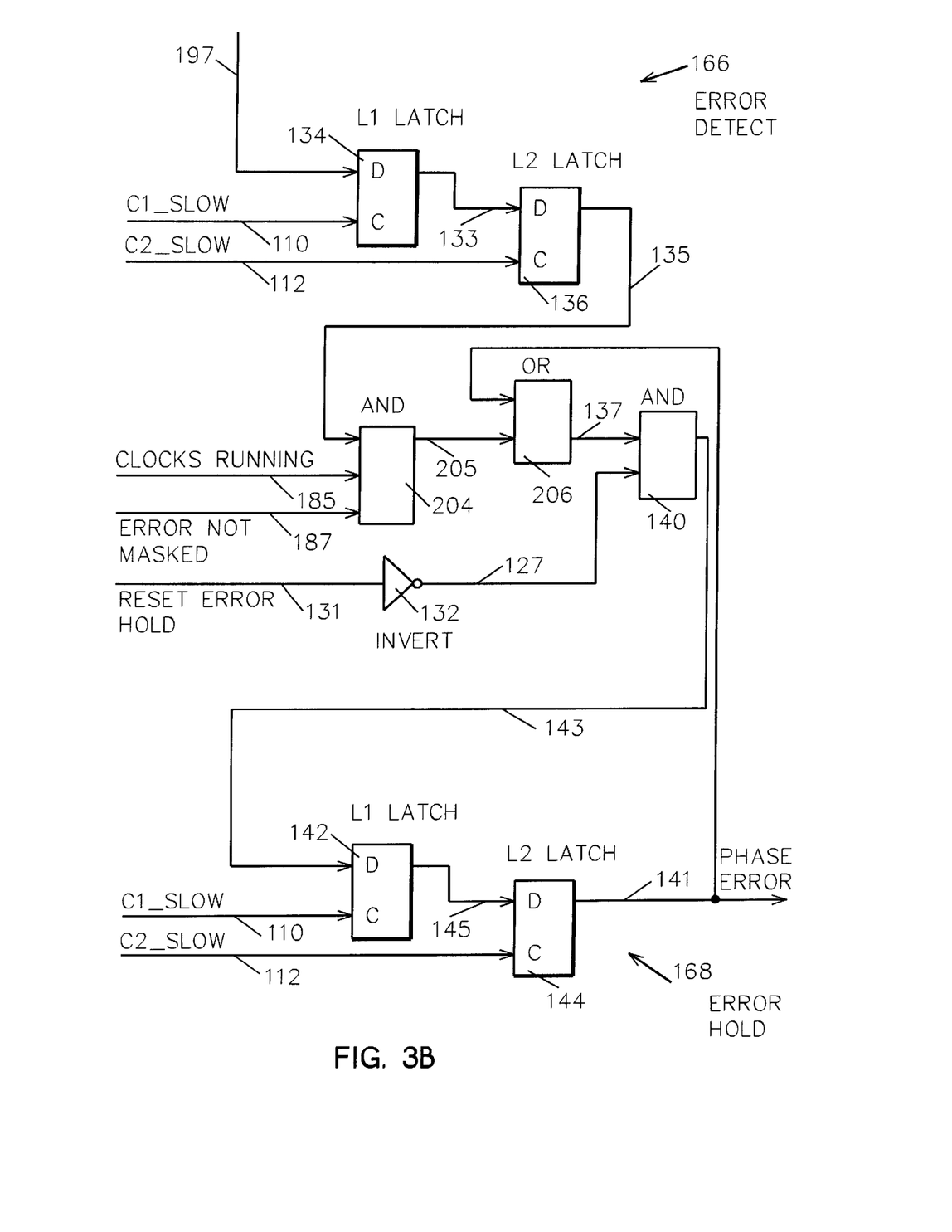

Referring to FIGS. 3A and 3B, a second preferred embodiment of the phase error detection circuit of the invention includes divide by two logic 160, cross domain sample logic 162, delayed sample logic 164, error detect logic 166 and error hold logic 168. Inputs to the clock phase alignment detection circuit include c1_slow clock 110, c2_slow clock 112, c1_fast clock 114, c2_fast clock 116, reset error hold 131, clocks running signal line 185 and error not masked signal line 187.

c1_slow clock signal 110 is fed to the control input (C) of divide by two L1 latch 170, error detect L1 latch 134, and error hold L1 latch 142. c2_slow clock signal 112 is fed to the control inputs (C) of divide by two L2 latch 172, error detect L2 latch 136 and error hold L2 latch 144. c1_fast clock signal 114 is fed to the control (C) inputs of cross domain sample L1 latch 180 and delayed sample L1 latch 190. c2_fast clock signal 116 is fed to the control (C) inputs of cross domain sample L2 latch 182 and delayed sample L2 latch 192. Clocks running signal line 185 and error not masked signal line 187 are fed to AND gate 204. Resent error hold signal 131 is inverted at invert block 132 and fed on line 127 to AND gate 140.

The output of latch 170 is fed on line 171 to the data (D) input of latch 172, the output of which on line 173 is inverted at invert block 174 and fed to the data input latches of latch 170 and cross domain sample L1 latch 180. The output of latch 180 is fed on line 181 to cross domain sample L2 latch 182, the output of which is fed on line 183 to the data input of delayed sample L1 latch 190 and XOR block 194. The output of latch 190 is fed on line 191 to the data input of delayed sample L2 latch 192, the output of which is fed on line 193 to XOR block 194. The output of XOR 194 on line 195 is inverted at block 196 and fed on line 197 to the data input of error detect L1 latch 134. The output of latch 134 on line 133 is fed to error detect L2 latch 136, the output of which is fed on line 135 to AND gate 204. The output of AND gate 204 is fed on line 205 to OR gate 206, the other input to which is phase error line 141 and the output of which is fed on line 137 to AND gate 140. The output of AND gate 140 is fed on line 143 to the data input of error hold L1 latch 142, the output of which on line 145 is fed to the data input of error hold L2 latch 144. The output of latch 144 is phase error signal 141.

In this second embodiment, FIGS. 3A and 3B, since the frequency ratio of the clock domains to be monitored is known to be 2:3 some simplifications to the general solution of the first embodiment, FIGS. 2A and 2b, are allowed. Specifically:

(1) Frequency divider 160 provides a waveform 175 of ($\omega$_slow/(s)) instead of ($\omega$_slow/(2*s)). Since (s)=2, this means using a divide-by-two instead of a divide-by-four frequency divider. The extra transition that occurs every two cycles does not result in a false phase error detection when (f) is 3, as is the case in this second embodiment.

(2) Since the output of frequency divider 160 has a transition every cycle in the $\omega$_slow domain, there is only one possible cycle alignment. Consequently it is not necessary to sequentially check for errors on every possible alignment, allowing for the elimination of the $\omega$_slow domain shift register 122 and the associated alignment selector (multiplexer) 130.

(3) The number of stages in the $\omega$_fast domain shift register 124 is reduced from (f) to (f–1) in cross domain sample 162 due to the higher frequency of output 175 of divider 160.

Referring further to the second embodiment of FIG. 3 in connection with the first embodiment of FIG. 2, the first latch, L1 latch 170, in divide by two circuit 160 is the frequency divider operating in the slow domain, and corresponds to the frequency divider 120 of the first embodiment. Cross domain sample 162 and delayed sample 164 latches 180, 182, 190 and 192 comprise the $\omega$_fast domain shift register, and correspond to shift register 124 in the first embodiment. Error detect 166 latches 134 and 136 and error hold latches 142, 144 are precisely the same as those found in the first embodiment. In this second embodiment, additional optional control signals 185, 187 are included to allow for software masking of phase error detection and automatic masking of phase error detection when the clocks in either domain are stopped.

The phase error detection circuit of either embodiment can be used at initialization time before cross domain operations are started, thereby eliminating false secondary errors. This is particularly advantageous when the phase error is the result of spurious initialization problems. In this case the PLL which sources the clocks can be repeatedly reset until a correct phase relationship is established or a retry threshold is reached. If the phase error is isolated after cross domain operations have begun, then the circuit of either embodiment can be used to increase the accuracy of automated failure isolation algorithms.

Figures 4, 4A:
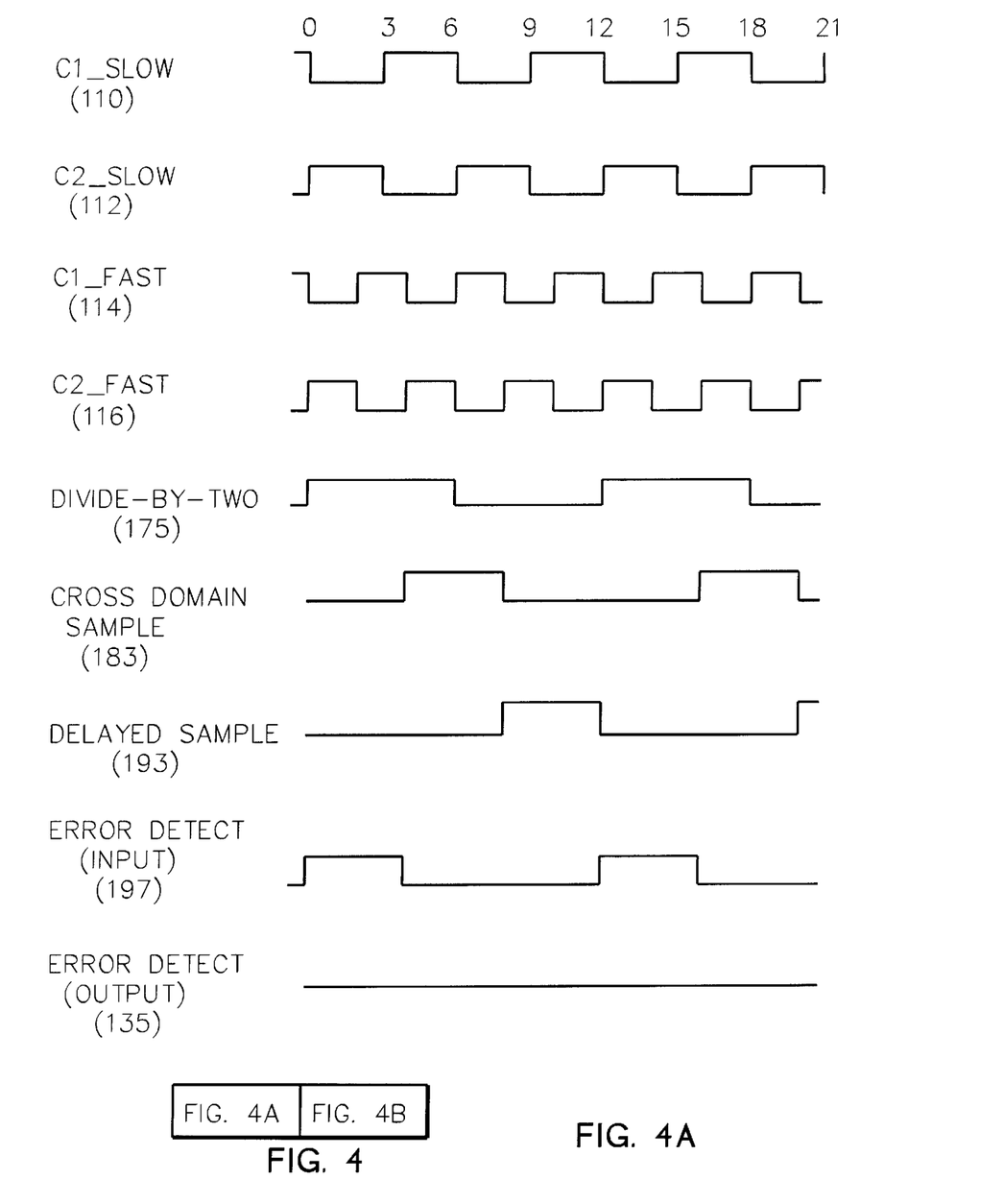
FIGS. 4A and 4B, arranged as illustrated in FIG. 4, are a timing chart illustrating the timing of the circuit of FIGS. 3A and 3B when operating in a correct phase relationship.
Figure 4B:
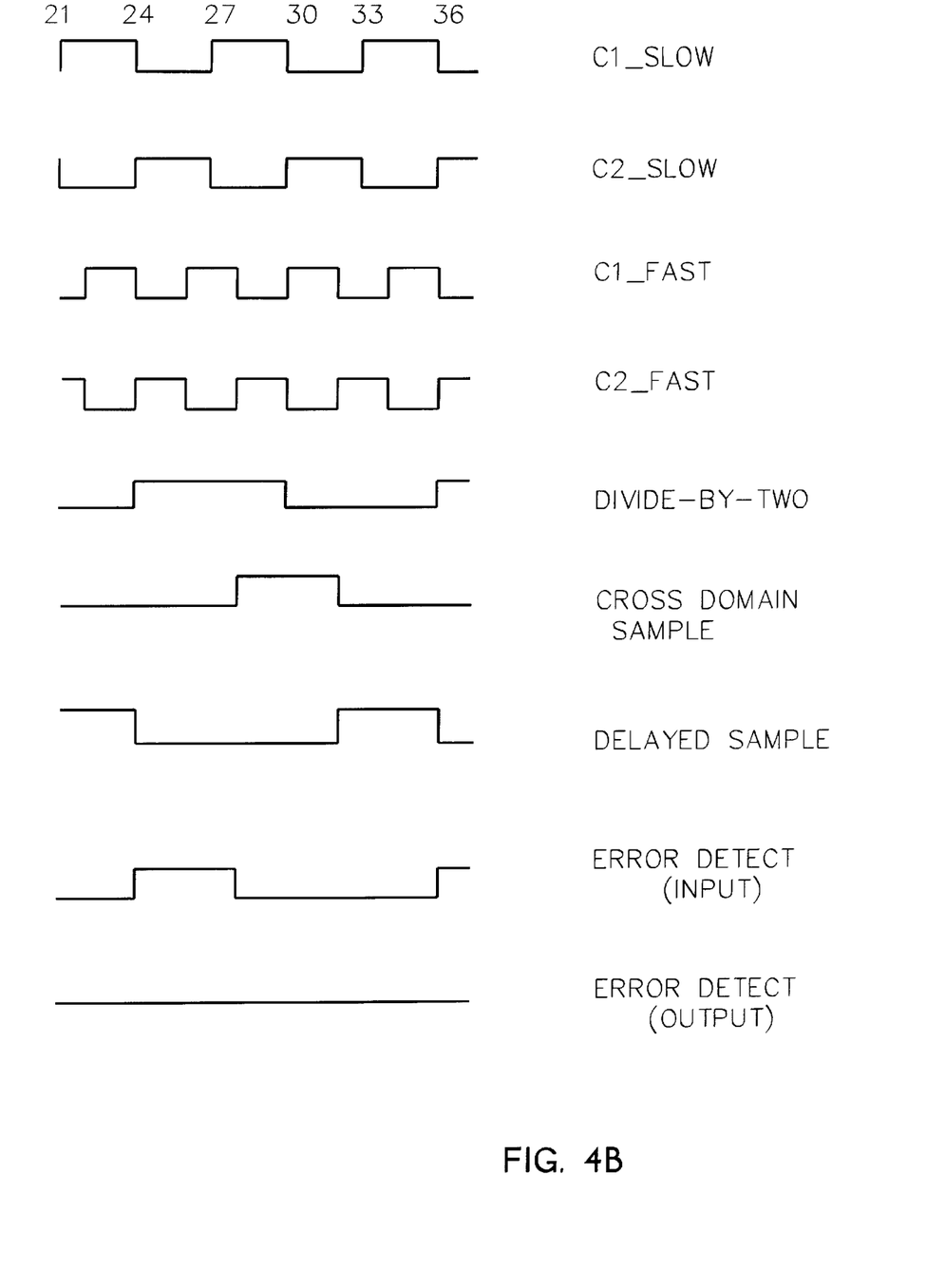

Referring to FIGS. 4A and 4B, the operation of the circuit of FIGS. 3A and 3B is illustrated when the clocks are in phase synchronization.

Figures 5, 5A:
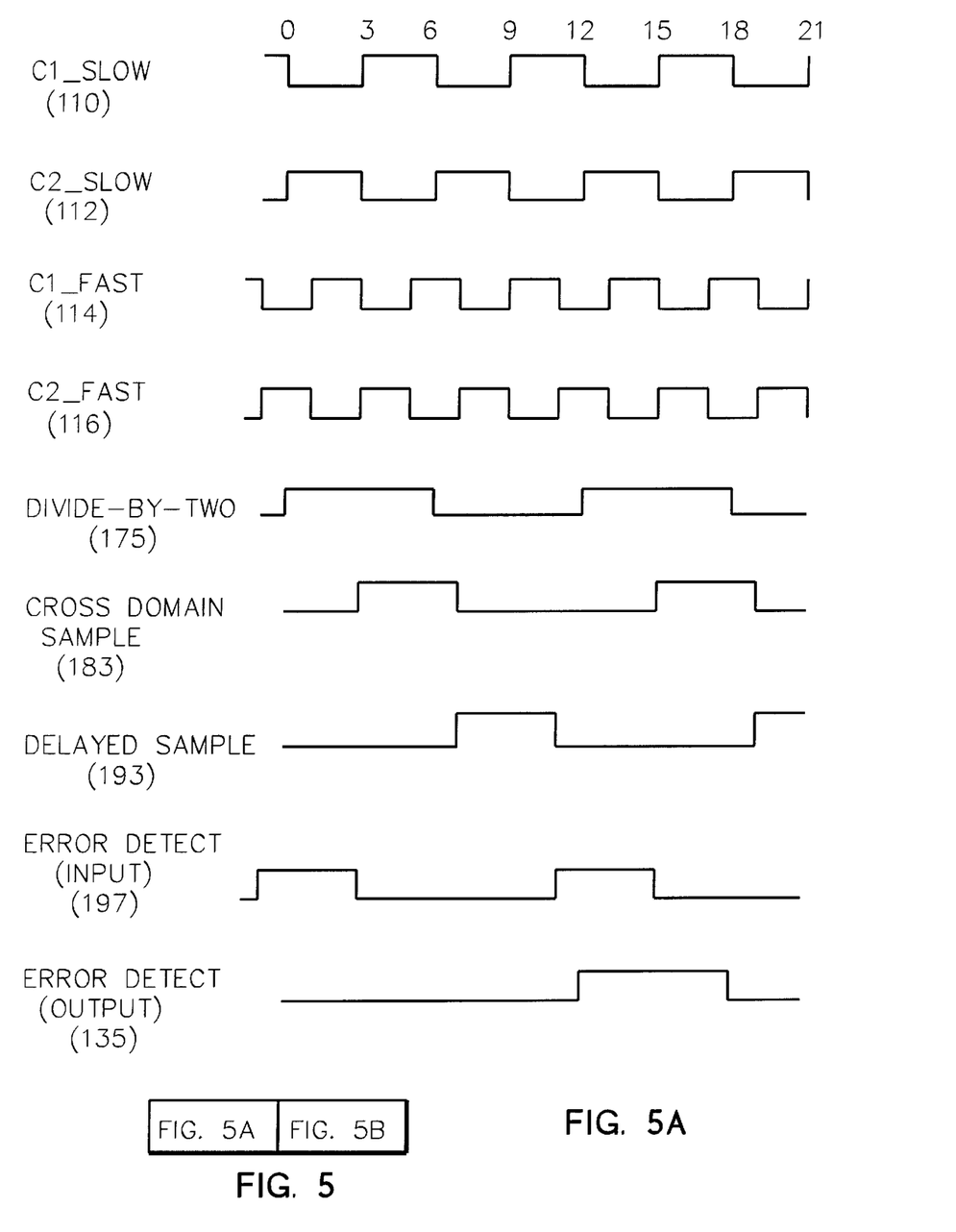
FIGS. 5A and 5B, arranged as illustrated in FIG. 5, are a timing chart illustrating the timing of the circuit of FIGS. 3A and 3B when operating out of correct phase relationship.
Figure 5B:
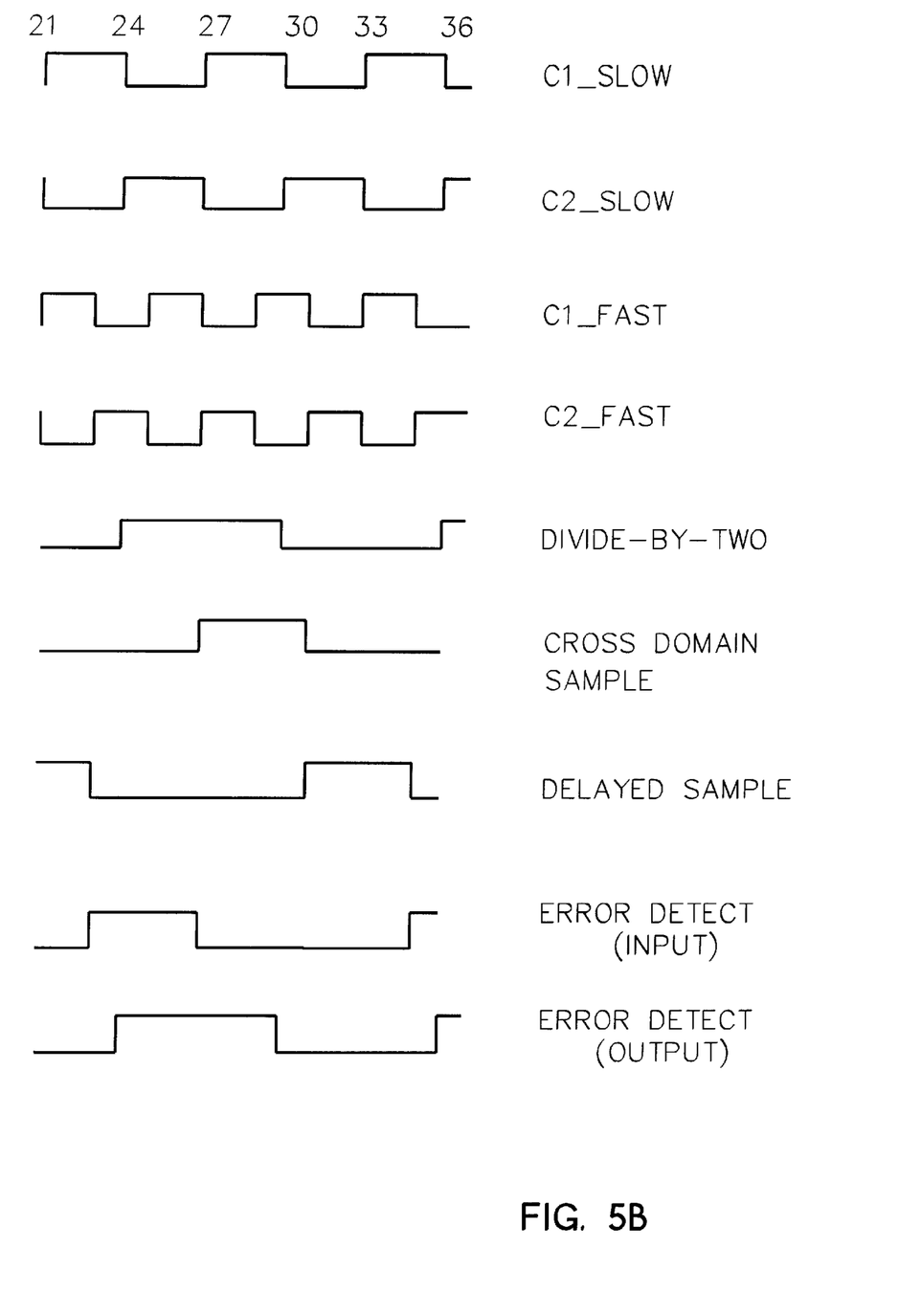

Referring to FIGS. 5A and 5B, the operation of the circuit of FIGS. 3A and 3B is illustrated when the clocks are out of phase.

In FIGS. 4 and 5, the error hold output 141 is not shown. This latch 144 output on line 141 is set to '1' whenever the output of the error capture latch 136 pulses. The error hold latch 144 then remains set until reset by external control line 131, such as under software control. Latch 136 is a polarity hold latch; its output changes at the rising edge of c2_slow and it captures whatever is present at its input at the fall of c1_slow. Since, for correctly aligned clocks, error detect (input) line 197 is never high at the falling edge of c1_slow line 110, no error is detected in FIG. 4. In FIG. 5, for incorrectly aligned clocks, this is not true, and an error is detected.

ADVANTAGES OVER THE PRIOR ART

The advantages of the system and method of the preferred embodiment of this invention include the provision of an improved circuit and method for detecting clock phase alignment errors.

It is a further advantage of the invention that there is provided an improved circuit and method for correct failure isolation.

It is a further advantage of the invention that there is provided an improved circuit and method for detecting phase alignment errors in an ASIC, such as those arising from circuit failure or incorrect PLL initialization.

It is a further advantage of the invention that there is provided an improved circuit and method for detecting incorrect clock phase alignment between synchronous clock domains by using fully synchronous signals and not requiring sampling rates in excess of the clock frequencies in either of the two domains being monitored.

It is a further advantage of the invention that there is provided an improved circuit and method for detecting incorrect clock phase alignment between synchronous clock domains on a chip with detection circuitry which performs accurately over the same process range that the rest of the chip is designed to meet, and do so without placing special requirements on logic synthesis and timing tools, without requiring custom design techniques, and without requiring embedded analog circuits.

ALTERNATIVE EMBODIMENTS

It will be appreciated that, although specific embodiments of the invention have been described herein for purposes of illustration, various modifications may be made without departing from the spirit and scope of the invention. In particular, it is within the scope of the invention to provide a memory device, such as a transmission medium, magnetic or optical tape or disc, or the like, for storing signals for controlling the operation of a computer according to the method of the invention and/or to structure its components in accordance with the system of the invention.

Accordingly, the scope of protection of this invention is limited only by the following claims and their equivalents.

We claim:

1. A phase error detection circuit for detecting phase misalignment between first clock signals operating in a slow time domain and second clock signals operating in a fast time domain, comprising:

a frequency divider;

a first shift register responsive to the output of said frequency divider and clocked in said slow time domain for sequentially sampling all possible alignments of said first clock signals;

a divider alignment selector for multiplexing the output of said frequency divider and said first shift register; and a second shift register clocked in said fast time domain and responsive to the output of said divider alignment selector for generating a phase error signal when the phase alignment is incorrect or said frequency divider is not switching in a correct cycle.

2. The phase error detection circuit of claim 1, further comprising:

state machine logic sequentially selecting frequency divider outputs and sampling said phase error signal for reporting a phase error when each possible alignment results in activation of said phase error signal.

3. A phase error detection circuit for detecting phase misalignment between first clock signals operating in a slow time domain and second clock signals operating in a fast time domain, comprising:

a frequency divider;

a first shift register responsive to the output of said frequency divider and clocked in said slow time domain for sequentially sampling all possible alignments of said clock signals;

a divider alignment selector for multiplexing the output of said frequency divider and said first shift register;

a second shift register clocked in said fast time domain and responsive to the output of said divider alignment selector for generating a phase error signal when the phase alignment is incorrect or the frequency divider is not switching in a correct cycle;

error detection logic clocked in said slow time domain for sampling and optionally masking said phase error signal;

error hold logic responsive to the output of said error detection logic for latching said phase error signal; and state machine logic sequentially selecting frequency divider outputs and sampling said phase error signal for reporting a phase error when each possible alignment results in activation of said phase error signal.

4. Method for detecting phase misalignment between first clock signals defining a slow time domain and second clock signals defining a fast time domain, comprising the steps of:

sequentially sampling all possible alignments of clock signals operating in said slow time domain to generate a sequence of alignment signals; and multiplexing said sequence of alignment signals through detector logic clocked in said fast time domain to generate a phase error signal when the phase alignment is incorrect.

5. A phase error detection circuit for detecting phase misalignment between first clock signals operating in a slow time domain and second clock signals operating in a fast time domain, comprising:

means for sequentially sampling all possible alignments of clock signals operating in said slow time domain to generate a sequence of alignment signals; and means for multiplexing said sequence of alignment signals through detector logic clocked in said fast time domain to generate a phase error signal when the phase alignment is incorrect.

6. A program storage device readable by a machine, tangibly embodying a program of instructions executable by a machine to perform method steps for detecting phase misalignment between first clock signals operating in a slow time domain and second clock signals operating in a fast time domain, said method steps comprising:

sequentially sampling all possible alignments of clock signals operating in said slow time domain to generate a sequence of alignment signals; and multiplexing said sequence of alignment signals through detector logic clocked in said fast time domain to generate a phase error signal when the phase alignment is incorrect.

7. An article of manufacture comprising:

a computer useable medium having computer readable program code means embodied therein for detecting phase misalignment between first clock signals operating in a slow time domain and second clock signals operating in a fast time domain, the computer readable program means in said article of manufacture comprising:

computer readable program code means for causing a computer to effect sequentially sampling all possible alignments of clock signals operating in said slow time domain to generate a sequence of alignment signals; and computer readable program code means for causing a computer to effect multiplexing said sequence of alignment signals through detector logic clocked in said fast time domain to generate a phase error signal when the phase alignment is incorrect.

8. A phase error detection circuit for detecting phase misalignment between first clock signals operating in a slow time domain and second clock signals operating in a fast time domain, the frequency ratio of said time domains being 2:3, comprising:

a divider circuit clocked in said slow time domain for dividing said first clock signals by two; and a shift register clocked in said fast time domain and responsive to the output of said divider circuit for generating a phase error signal when the phase alignment is incorrect.

9. The phase error detection circuit of claim 8, further comprising:

error detection logic clocked in said slow time domain for sampling and optionally masking said phase error signal; and error hold logic responsive to the output of said error detection logic for latching said phase error signal.

10. A method for detecting phase misalignment between first clock signals operating in a slow time domain and second clock signals operating in a fast time domain, the frequency ratio of said time domains being 2:3, comprising the steps of:

operating a divider circuit clocked in said slow time domain to divide said first clock signals by two; and operating a shift register clocked in said fast time domain and responsive to the output of said divider circuit for generating a phase error signal when the phase alignment is incorrect.

11. A phase error detection circuit for detecting phase misalignment between first clock signals operating in a slow time domain and second clock signals operating in a fast time domain, the frequency ratio of said time domains being 2:3, comprising:

divider circuit means clocked in said slow time domain for dividing said first clock signals by two; and shift register means clocked in said fast time domain and responsive to the output of said divider circuit for generating a phase error signal when the phase alignment is incorrect.

12. A program storage device readable by a machine, tangibly embodying a program of instructions executable by a machine to perform method steps for detecting phase misalignment between first clock signals operating in a slow time domain and second clock signals operating in a fast time domain, the frequency ratio of said time domains being 2:3, said method steps comprising:

operating a divider circuit clocked in said slow time domain to divide said first clock signals by two; and operating a shift register clocked in said fast time domain and responsive to the output of said divider circuit for generating a phase error signal when the phase alignment is incorrect.

13. An article of manufacture comprising:

a computer useable medium having computer readable program code means embodied therein for detecting phase misalignment between first clock signals operating in a slow time domain and second clock signals operating in a fast time domain, the frequency ratio of said time domains being 2:3, the computer readable program means in said article of manufacture comprising:

computer readable program code means for causing a computer to effect operating a divider circuit clocked in said slow time domain to divide said first clock signals by two; and computer readable program code means for causing a computer to effect operating a shift register clocked in said fast time domain and responsive to the output of said divider circuit for generating a phase error signal when the phase alignment is incorrect.

* * * * *